(12) United States Patent
Yamamoto

(10) Patent No.: US 6,239,654 B1
(45) Date of Patent: May 29, 2001

(54) FILTER CIRCUIT

(75) Inventor: Seiji Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/418,515

(22) Filed: Oct. 15, 1999

(30) Foreign Application Priority Data

May 28, 1999 (JP) .................................................. 11-149943

(51) Int. Cl.$^7$ ........................................................ H03F 1/02
(52) U.S. Cl. ............................... 330/9; 330/303; 327/554
(58) Field of Search .............................. 330/9, 303, 305; 327/554

(56) References Cited

U.S. PATENT DOCUMENTS

| | | | |
|---|---|---|---|
| 5,345,190 | * 9/1994 | Kaylor | 330/258 |
| 5,491,447 | * 2/1996 | Goetschel et al. | 330/254 |
| 5,594,383 | * 1/1997 | Tamba | 327/552 |
| 5,764,100 | * 6/1998 | Callicotte et al. | 327/554 |
| 5,953,379 | 9/1999 | Myers et al. | 375/344 |
| 6,069,522 | * 7/2000 | Venkatraman et al. | 327/552 |
| 6,084,465 | * 7/2000 | Dasgupta | 327/554 |

FOREIGN PATENT DOCUMENTS

| | | |
|---|---|---|
| 7-193454 | 7/1995 | (JP) . |
| 367682 | 8/1988 | (TW) . |

* cited by examiner

Primary Examiner—Robert Pascal
Assistant Examiner—Henry Choe
(74) Attorney, Agent, or Firm—Leydig, Voit & Mayer, Ltd

(57) ABSTRACT

An automatic cut-off frequency adjustment circuit includes n analog switches and n capacitors, each having a different capacitance, connected to respective ones of the n analog switches. The n analog switches are connected to an output terminal of a first operation transconductance amplifier (OTA). Further, the adjustment circuit includes m analog switches and m capacitors, each having a different capacitance, connected to respective ones of m analog switches. The m analog switches are connected to an output terminal of a second OTA. By turning ON one of the n analog switches connected to the first OTA and one of the m analog switches connected to the second OTA, capacitors having desired capacitance are selected from the capacitors constituting a filter section. As a result, the adjustment range of the cut-off frequency by the automatic cut-off frequency adjustment circuit can be expanded.

3 Claims, 10 Drawing Sheets

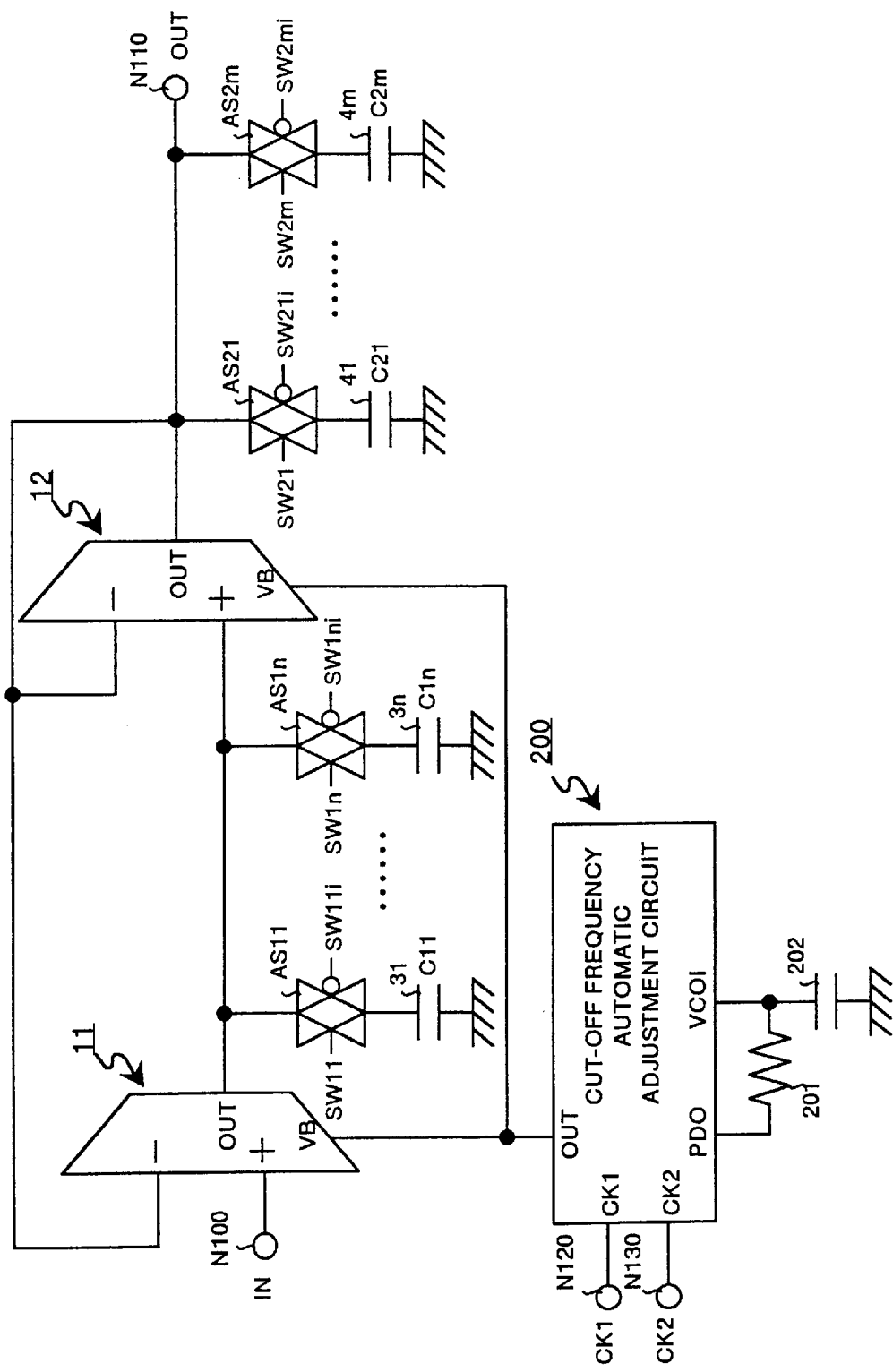

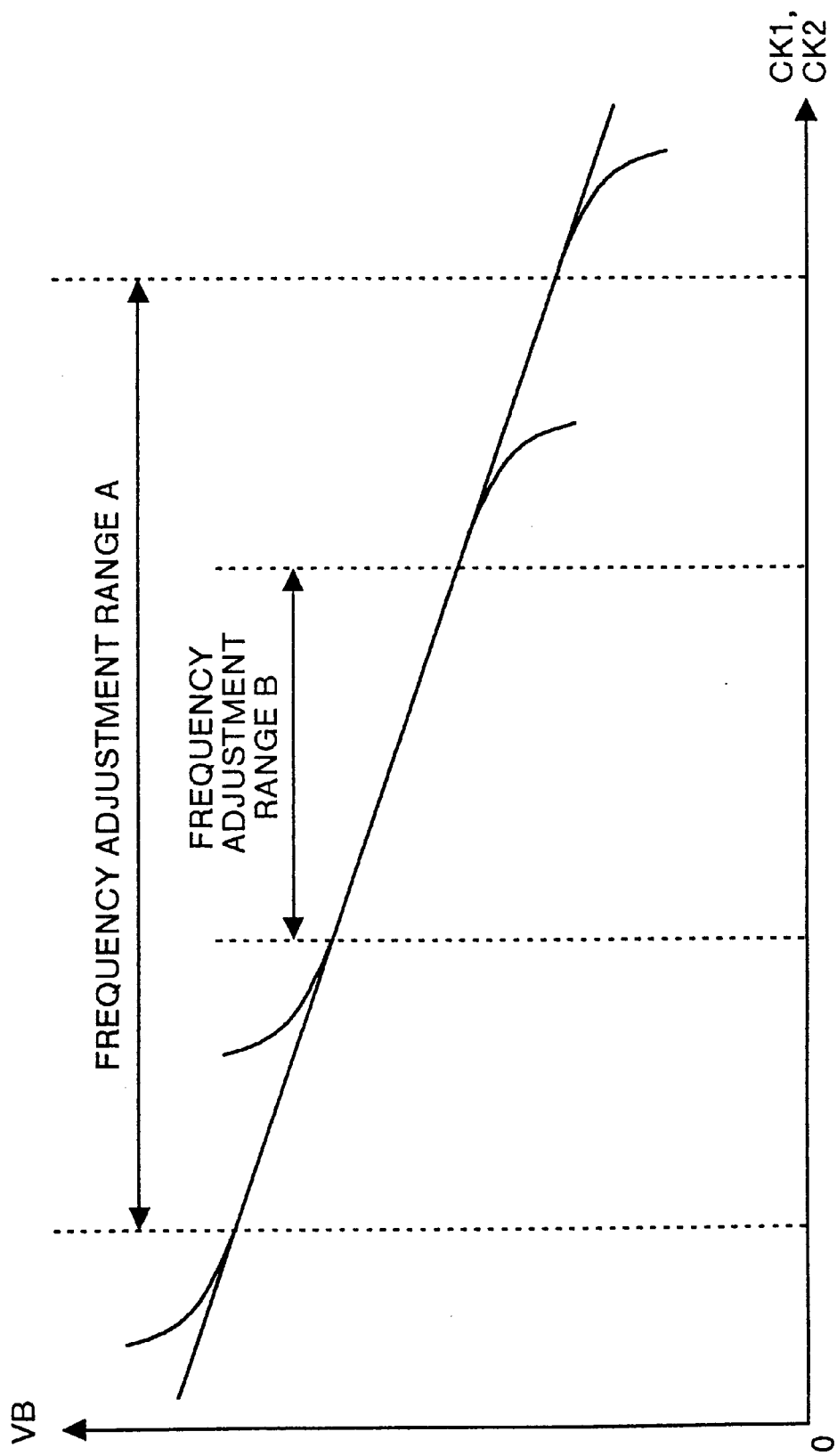

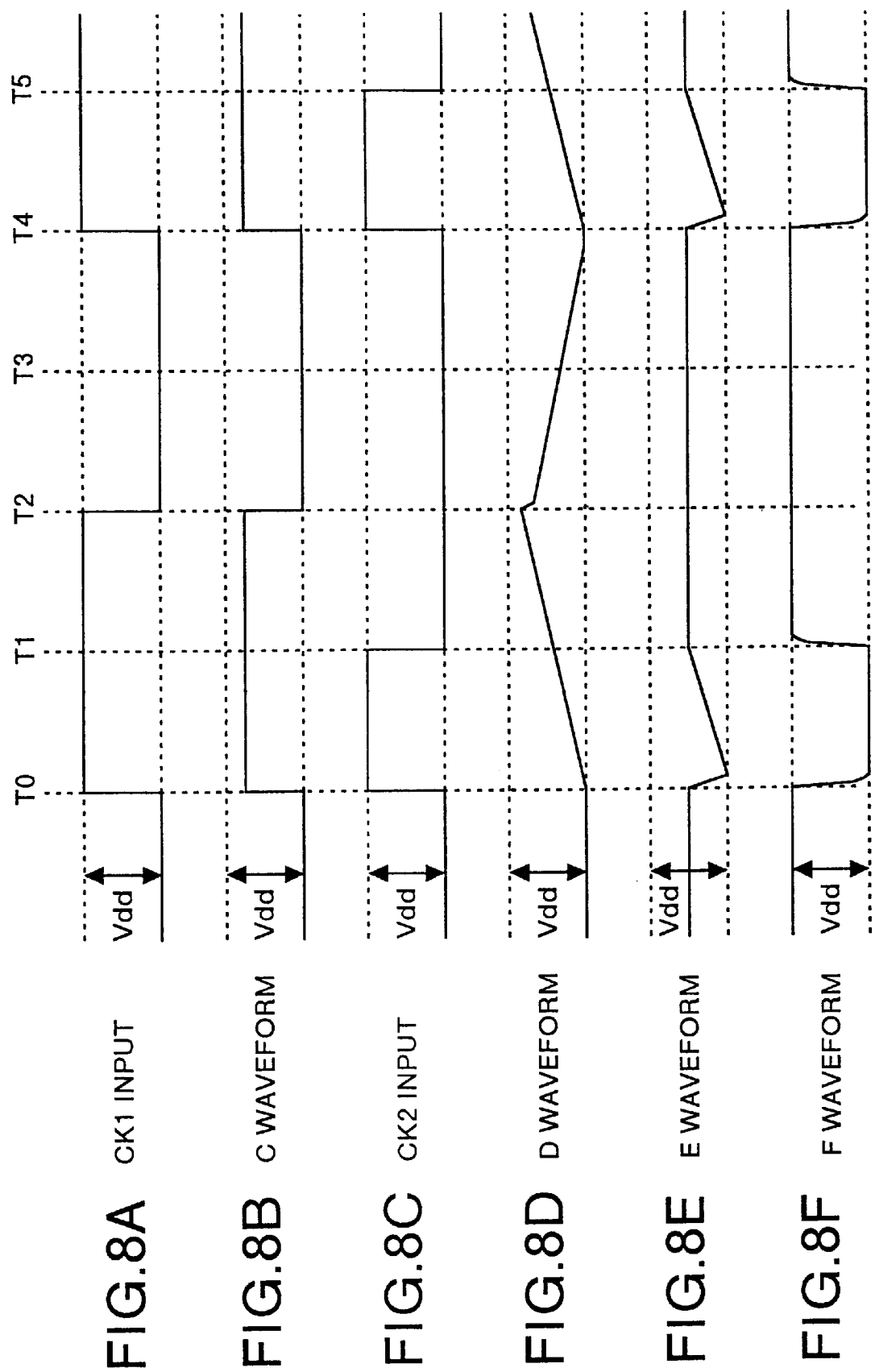
FIG.8A CK1 INPUT
FIG.8B C WAVEFORM
FIG.8C CK2 INPUT
FIG.8D D WAVEFORM
FIG.8E E WAVEFORM
FIG.8F F WAVEFORM

FILTER CIRCUIT

FIELD OF THE INVENTION

The present invention relates to a filter circuit comprising an operation transconductance amplifier (OTA) and more particularly to a filter circuit capable of changing a variable range of a cut-off frequency operation transconductance amplifier.

BACKGROUND OF THE INVENTION

Conventionally, in LSIs for RF band signal processing for mobile transmission, a filter circuit is used in which time constant is constituted not of a resistor as a discrete element and a capacitor but an operation transconductance amplifier (OTA) and a capacitor. Further, an integrated filter circuit having a general purpose property intensified by adding a cut-off frequency automatic adjustment circuit capable of automatic adjustment of the cut-off frequency is often employed in such a filter.

FIG. 5 shows a circuit diagram of a conventional filter circuit having a OTA and the cut-off frequency automatic adjustment circuit, used in an analog signal processing system. Referring to FIG. 5, the conventional filter circuit comprises OTA 101, OTA 102, capacitor 111 (capacitance C110), capacitor 112 (capacitance C120) and the cut-off frequency automatic adjustment circuit 200. A resistor 201 and a capacitor 202, which are external adjustment elements, are connected to the cut-off frequency automatic adjustment circuit 200.

In the OTA 101, a signal which is an object for filtering is inputted through a positive phase input terminal N100 and an output terminal thereof is connected to the positive phase input terminal of the OTA 102. An output terminal of the OTA 102 is connected to inverse phase input terminals of the OTA 101 and OTA 102. The OTA 101 and OTA 102 receive a signal outputted from the cut-off frequency automatic adjustment circuit 200 as a bias voltage. As a result, the OTA 101 and OTA 102 function as active loads of high input impedance and low output impedance.

The aforementioned capacitor 111 a terminal of which is grounded is connected to the output terminal of the OTA 101 and similarly the aforementioned capacitor 112 a terminal of which is grounded is connected to the output terminal of the OTA 102. Therefore, the filter section is constituted of the OTA 101 as an active load and the capacitor 111, and the OTA 102 as an active load and the capacitor 112, and a filtered signal can be outputted from the output terminal of the OTA 102. The frequency characteristic of this filter section is determined by the transconductances of the OTA 101 and OTA 102 and the capacitances of the capacitors 111, 112.

FIG. 6 is a circuit diagram common to the OTA 101 and OTA 102 and specifically indicates a differential amplification circuit section. The differential amplification circuit section shown in FIG. 6 comprises a P-channel type MOS transistor M10 for supplying a constant current to a pair of the differential transistors described below by inputting the bias voltage VB, a P-channel type MOS transistor M11 and a P-channel type MOS transistor M12, both acting as a pair of the differential transistors, and a N-channel type MOS transistor M13 and a N-channel type MOS transistor M14, both constituting a current mirror circuit functioning as an active load on the amplifier.

In this differential amplifying circuit section, a source of the MOS transistor M10 is connected to a power line which supplies a power voltage Vdd (high level voltage) and a gate thereof is connected to a terminal which supplies the bias voltage VB. In the MOS transistor M11 and MOS transistor M12, sources thereof are connected to each other, thereby constituting a pair of the differential transistor. Further, the sources of the MOS transistor M11 and MOS transistor M12 are connected to a drain of the MOS transistor M10, so that a current supplied through the MOS transistor M10 is supplied to the pair of the differential transistors constituted of the aforementioned MOS transistor M11 and MOS transistor M12.

A gate of the MOS transistor M11 is connected to an input node N190 of this differential amplification circuit section, namely to positive phase input terminals of the OTA 101 or OTA 102. Specifically, the gate of the MOS transistor M11 is connected to terminal N100 in the OTA 101 from where a signal which is an object for filtering is inputted. Further, a gate of the MOS transistor M12 is connected to the other input terminal N200 of the differential amplification circuit section, namely to inverse phase input terminal of the OTA 101 or OTA 102.

The gates of the MOS transistor M13 and MOS transistor M14 are connected to each other. The gate and drain of the MOS transistor M13 are connected to form a current mirror circuit. Sources of the MOS transistor M13 and MOS transistor M14 are connected to a line of grounding voltage Vss (low level voltage).

A difference between signals inputted into the input node N190 and input node N200 is amplified by this differential amplification circuit section. The amplified signal is outputted from the input node N210 connected to the drain of the MOS transistor M12 as an output signal. In the OTA 101 and OTA 102, because the respective inverse phase input terminals thereof corresponding to the input node N200 are connected to the output terminal of the OTA 102 a negative feedback loop with gain 1 is formed, thereby the OTA 101 and OTA 102 act as an active load.

On the other hand, FIG. 7 is a circuit diagram showing a structure of the cut-off frequency automatic adjustment circuit. The cut-off frequency automatic adjustment circuit 200 shown in FIG. 7 comprises an OTA 103 having the same structure as the aforementioned OTA 101 and 102, a comparator 240 and a sample hold circuit 300. The positive phase input terminal (+) of the OTA 103 is connected to a contact terminal of each of the analog switches 221, 222 and its inverse phase input terminal (−) is connected to an output node for dividing a voltage supplied from the power line by resistors 213, 214 connected in series, namely a joint between the resistors 213 and 214.

The other contact terminal of the analog switch 221 is connected to an output node for dividing a voltage supplied from the power line by the resistors 211, 212 connected in series, namely a joint between the resistors 211 and 212. The other contact terminal of the analog switch 222 is grounded.

The analog switch 221 inputs a clock CK1 into the N-channel type MOS transistor and a clock CK1$i$ into the P-channel type MOS transistor as a change-over signal. The analog switch 222 inputs a clock CK1$i$ into the N-channel type MOS transistor and a clock CK1 into the P-channel type MOS transistor side as a change-over signal.

The clock CK1 is a clock inputted from the clock input terminal N120 and the clock CK1$i$ is a signal obtained by inverting the input of the clock CK1 by an inverter 251 as shown in the Figure. As a result, the analog switches 221, 222 are turned ON/OFF complementarily by the clocks CK1, CK1$i$.

Thus, in the OTA 103, a partial value supplied by the resistors 213, 214 is inputted into the inverse phase input terminal as a reference voltage and then, a signal changed over by the clock CK1 or either a partial voltage supplied by the resistors 213, 214 or grounding voltage is inputted into the positive phase input terminal and a signal based on a difference between these signals is outputted. Further, the OTA 103 receives a voltage determined by the sample hold circuit 300, which will be described later, and the resistor 201 and capacitor 202, which are the aforementioned external adjustment devices, as the bias voltage VB.

One of the terminals of a capacitor 231 (capacitance C100) and a contact terminal of the analog switch 223 are connected to an output terminal of the OTA 103. The other terminal of the capacitor 231 is grounded. The analog switch 223 inputs a clock CK2 into the N-channel type MOS transistor and a clock CK2$i$ to the P-channel type MOS transistor as change-over signal.

The clock CK2 is a clock signal inputted from the clock input terminal N130 like the aforementioned clock CK1. The clock CK2$i$ is a signal obtained by inverting the clock CK2 by an inverter 252 as shown in the Figure. Thus, the analog switch 223 is turned ON/OFF by these clocks CK2 and CK2$i$.

One of the terminals of a capacitor 232 (capacitance C200) and a positive phase input terminal of the comparator 240 are connected to the other contact terminal of the analog switch 223. The other terminal of the capacitor 232 is grounded. The same signal as a signal inputted into the inverse phase input terminal of the OTA 103, namely the voltage divided by the resistors 213, 214 is inputted into the inverse phase input terminal of the comparator 240.

Thus, due to ON/OFF of the analog switch 223, output voltage from the OTA 103 charged in the capacitor 231 can be held by the capacitor 232. This voltage held in the capacitor 232 is compared to the reference voltage determined by the aforementioned resistors 213, 214 by the comparator 240 and a result of comparison is outputted as a logical level.

The sample hold circuit 300 comprises a delay flip-flop 301, a P-channel type MOS transistor M31 and a N-channel type MOS transistor M32. The output of the comparator 240 is inputted into the D input of the delay flip-flop 301.

The aforementioned clock CK1 is used as a rising edge clock input (T input) of the delay flip-flop 301. QC output of the delay flip-flop 301 is inputted into gate of the MOS transistor M31 and gate of the MOS transistor M32. A signal having a level of inverted clock CK1 is inputted into T input of the delay flip-flop 301. The MOS transistor M31 and MOS transistor M32 constitute a complementary circuit and drains of these transistors function as a charge pump.

Drains of the MOS transistor M31 and MOS transistor M32 are connected to PDO terminal N300 and a source of the MOS transistor M31 is connected to a power line while a source of the MOS transistor M32 is grounded. The PDO terminal N200 is connected to the resistor 201 which is an external adjustment device as shown in FIG. 5 and this resistor is grounded through the capacitor 202. That is, a voltage outputted from the drains of the MOS transistor M31 and MOS transistor M32 is held (sample hold) by the capacitor 202.

VCOI terminal N310 shown in FIG. 7 is connected to an output terminal 220 of the cut-off frequency automatic adjustment circuit 200 and further connected to a joint between the resistor 201 and capacitor 202 as shown in FIG. 5. That is, the sample held voltage in the capacitor 202 is outputted from the cut-off frequency automatic adjustment circuit 200 and inputted as the bias voltage VB for the OTAs 101, 102 constituting the filter section, while it is inputted as the bias voltage VB for the OTA 103 within its own circuit.

Next, operation of the conventional filter circuit described above is described here. In this filter circuit, the cut-off frequency fc and quality factor Q are expressed as follows.

$$fc = \frac{1}{2\pi}\sqrt{\frac{gm1 \cdot gm2}{C110 \cdot C120}} \quad (1)$$

$$Q = \frac{1}{2\pi}\sqrt{\frac{gm1 \cdot C120}{gm2 \cdot C110}}$$

where gm1 and gm2 indicate transconductances of the OTA 101 and OTA 102 and can be expressed as follows.

gm1=½×K'×W'/L'×(Vdd−VB−Vthp')

gm2=½×K"×W"/L"×(Vdd−VB−Vthp")

In the above expression, K' indicates mobility, W'/L' indicates a transistor size, Vdd indicates a voltage of the source of and Vthp' indicates a threshold of the MOS transistor M10 in OTA 101. Similarly K" indicates mobility, W"/L" indicates transistor size and Vthp" indicates a threshold of the MOS transistor M10 in the OTA 102

The cut-off frequency of the filter circuit is determined by these gm1, gm2, C110 and C120 as described above and particularly because the transconductances gm1, gm2 use the bias voltage VB as one of the parameters, by changing this bias voltage VB, a desired cut-off frequency can be set up. The cut-off frequency automatic adjustment circuit 200 enables to change the cut-off frequency by inputting the bias voltage VB into the OTAs 101 and 102 corresponding to the frequencies of the clocks CK1 and CK2.

Next, operation of the cut-off frequency automatic adjustment circuit 200 will be described. FIG. 8A to FIG. 8F are timing chart that explain the operation of the cut-off frequency automatic adjustment circuit 200. In FIG. 7, the partial value determined by the resistors 211, 212 and the partial value determined by the resistors 213, 214 are set up such that a voltage of the OTA 103 outputted when the clock CK1 has logical level "H" is a value near the logical level "H", and if the voltage held in the capacitor 232 exceeds the aforementioned reference voltage, the comparator 240 outputs the logical level "H".

As shown in FIG. 8A, if the clock CK1 has a logical level "H" at time T0, then the analog switch 221 is turned ON while the analog switch 222 is turned OFF. As shown in FIG. 8B, the partial value determined by the resistors 211, 212 is inputted into the positive phase input terminal of the OTA 103 (point C in FIG. 7). As a result, a positive voltage is outputted from the OTA 103 and charged in the capacitor 231 as shown in FIG. 8D (point D in FIG. 7).

As shown in FIG. 8C, if the clock CK2 has a logical level "H" at time T0, the analog switch 223 is turned ON, so that a voltage outputted from the OTA 103 is charged in the capacitor 232 as shown in the FIG. 8E (point E in FIG. 7). Because the voltage at the point E inputted into the positive phase input terminal of the comparator 240 has not reached the reference voltage to be inputted into the inverse phase input terminal, the logical level "L" is outputted as shown in FIG. 8F (point F in FIG. 7).

Further, at time T0, the grounding voltage or a holding voltage of the capacitor 232 not sufficiently charged is inputted into the positive phase input terminal of the comparator 240 and the logical level "H" is inputted into the D input of the delay flip-flop 301. However, because the clock CK1 has the logical level "H", the logical level "L" is inputted into T input and an inversion level "L" of the logical level "H" which is a holding voltage of D input is outputted from the QC output.

Consequently, the MOS transistor M31 is turned ON and the MOS transistor M32 is turned OFF, so that a power voltage is outputted to the PDO terminal. As a result, the capacitor 202 shown in FIG. 5 is charged.

Then, at time T1, only the clock CK2 is turned to the logical level "L" so that the analog switch 223 is turned OFF, an output voltage of the OTA 103 is held by the capacitor 232 as shown in FIG. 8E. Because this output voltage exceeds the reference voltage of the comparator 240, the logical level "H" is outputted from the comparator 240 as shown in FIG. 8F.

A voltage having the logical level "H" outputted from the comparator 240 is inputted into D input of the delay flip-flop 301. Because at this time, the clock CK1 has the logical level "H", inverted level "L" of the logical level "H" is inputted into T input. Then, the logical level "H" is outputted from the QC output, so that the MOS transistor M31 is turned OFF and the MOS transistor M32 is turned ON, and a grounding voltage is outputted to the PDO terminal. As a result, a voltage held by the capacitor 202 shown in FIG. 5 is discharged. This means that the voltage charged in the capacitor 202 till this time becomes a voltage to be outputted as the bias voltage VB.

If at time T2, the clock CK1 has a logical level "L", the analog switch 221 is turned OFF and the analog switch 222 is turned ON. As a result, an output of the OTA 101 becomes a grounding voltage or negative voltage, so that a potential at the point D in FIG. 7 gradually drops due to discharging of the capacitor 231 as shown in FIG. 8D.

Because the clock CK2 still has the logical level "L", the analog switch 223 is kept OFF and a voltage held by the capacitor 232 is inputted into the positive phase input terminal of the comparator 240. Therefore, a voltage to be outputted from the PDO terminal is maintained at the grounding voltage.

At time T4, when the clock CK1 and clock CK2 once more become the logical level "H", the aforementioned operation is repeated. As a result, in the cut-off frequency automatic adjustment circuit 200, a maximum voltage to be charged or discharged by the capacitor 202 can be changed by the frequencies of the clocks CK1, CK2 and this voltage can be inputted into the OTAs 101, 102 as the bias voltage VB.

Further, the cut-off frequency automatic adjustment circuit 200 also functions as a circuit capable of absorbing a deflection of the capacitors C110, C120 and a deflection of the threshold Vthp of the MOS transistor M10.

However, in the conventional filter circuit described above, because the adjustment range of the cut-off frequency is determined by only the frequencies of the clocks CK1, CK2 inputted into the cut-off frequency automatic adjustment circuit 200, there are problems that the adjustment range is relatively narrow and a demand for adjustment of the cut-off frequency in a wide range cannot be met.

SUMMARY OF THE INVENTION

Accordingly, the present invention has been achieved to solve the above problems and therefore, it is an object of the invention to provide a filter circuit capable of adjusting the frequency in a wide range.

To achieve the above object, in the filter circuit according to a first aspect of the present invention, a bias voltage outputted from a cut-off frequency automatic adjustment unit is inputted into a bias voltage input terminal of an operation transconductance amplifier (OTA), and a plurality of capacitors each having a different capacitance are connected to the output terminal of the operation transconductance amplifier. Further, one of a plurality of these capacitors is selected as the capacitor to be connected to the operation transconductance amplifier. Thus in this filter circuit, it becomes possible to change the frequency adjustment range of the cut-off frequency automatic adjustment unit.

In the filter circuit according to a second aspect of the present invention, a bias voltage outputted from a cut-off frequency automatic adjustment unit is inputted into a bias voltage input terminal of a first and a second operation transconductance amplifier (OTA), and a plurality of the capacitors each having a different capacitance are connected to the output terminal of these first and second operation transconductance amplifiers through analog switches. Further, the cut-off frequency automatic adjustment unit automatically adjusts the cut-off frequency of a filter section comprising the first and the second operation transconductance amplifiers and said first and second capacitors by changing the bias voltages inputted into the first and the second operation transconductance amplifiers based on the frequency of a clock signal inputted from outside. Further, one of a plurality of capacitors is selected as the capacitor to be connected to the first operation transconductance amplifier with the help of analog switches and one of a plurality of capacitors is selected as the capacitor to be connected to the first operation transconductance amplifier with the help of analog switches. Thus in this filter circuit, it becomes possible to change the bias voltage to be inputted into the operation transconductance amplifier based on the frequency of the clock signal supplied from outside. In addition, it becomes possible to change the frequency adjustment range of the cut-off frequency automatic adjustment unit.

In the filter circuit according to a third aspect of the present invention, a bias voltage outputted from a cut-off frequency automatic adjustment unit is inputted into a bias voltage input terminal of an operation transconductance amplifier (OTA), and this operation transconductance amplifier has a plurality of transistors each having a different transistor size into which the bias voltage from the cut-off frequency automatic adjustment unit may be inputted. Further, one of a plurality of these transistors is selected as the transistors to which the bias voltage from the cut-off frequency automatic adjustment unit may be inputted. Thus in this filter circuit, it becomes possible to change the frequency adjustment range of the cut-off frequency automatic adjustment unit. In addition, it becomes possible to change the bias voltage to be inputted into the operation transconductance amplifier based on the frequency of the clock signal supplied from outside.

In the filter circuit according to a forth aspect of the present invention, a bias voltage outputted from a cut-off frequency automatic adjustment unit is inputted into a bias voltage input terminal of an operation transconductance amplifier (OTA), and the cut-off frequency automatic adjustment unit has a sample hold circuit for holding a voltage to be inputted into the operation transconductance amplifier. This sample hold circuit has a plurality of resistors each having a different resistance and a selecting unit for selecting any one of these plurality of resistors. Thus in this filter circuit, it becomes possible to change the bias voltage to be inputted into the operation transconductance amplifier based on the frequency of the clock signal supplied from outside.

Other objects and features of this invention will become understood from the following description with reference to the accompanying drawings.

BRIEF DESCRIPTION OF THE DRAWINGS

FIG. 1A and FIG. 1B are circuit diagrams showing structure of a filter circuit according to a first embodiment of the present invention;

FIG. 2 is a diagram showing a characteristic graph of the relation between frequency and bias voltage VB of the clocks CK1, CK2 in the filter circuit of the first embodiment;

FIG. 8A to FIG. 8F are timing charts that explain the operation of the cut-off frequency automatic adjustment circuit of the conventional filter circuit.

DESCRIPTION OF THE PREFERRED EMBODIMENTS

Hereinafter, the embodiments of a filter circuit of the present invention will be described in detail with reference to the accompanying drawings. These embodiments do not restrict the present invention to any particular one.

Figure 1B:
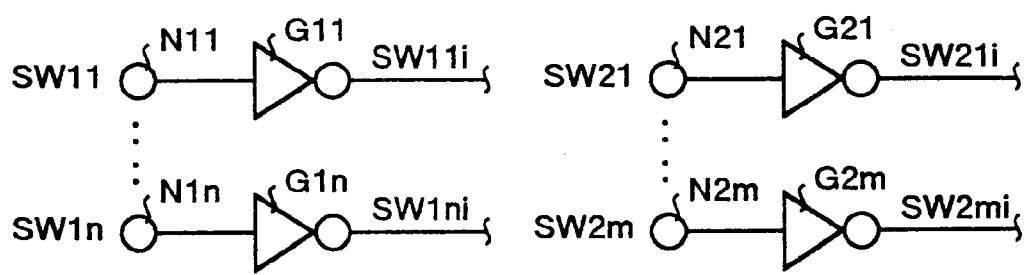
Figure 5:
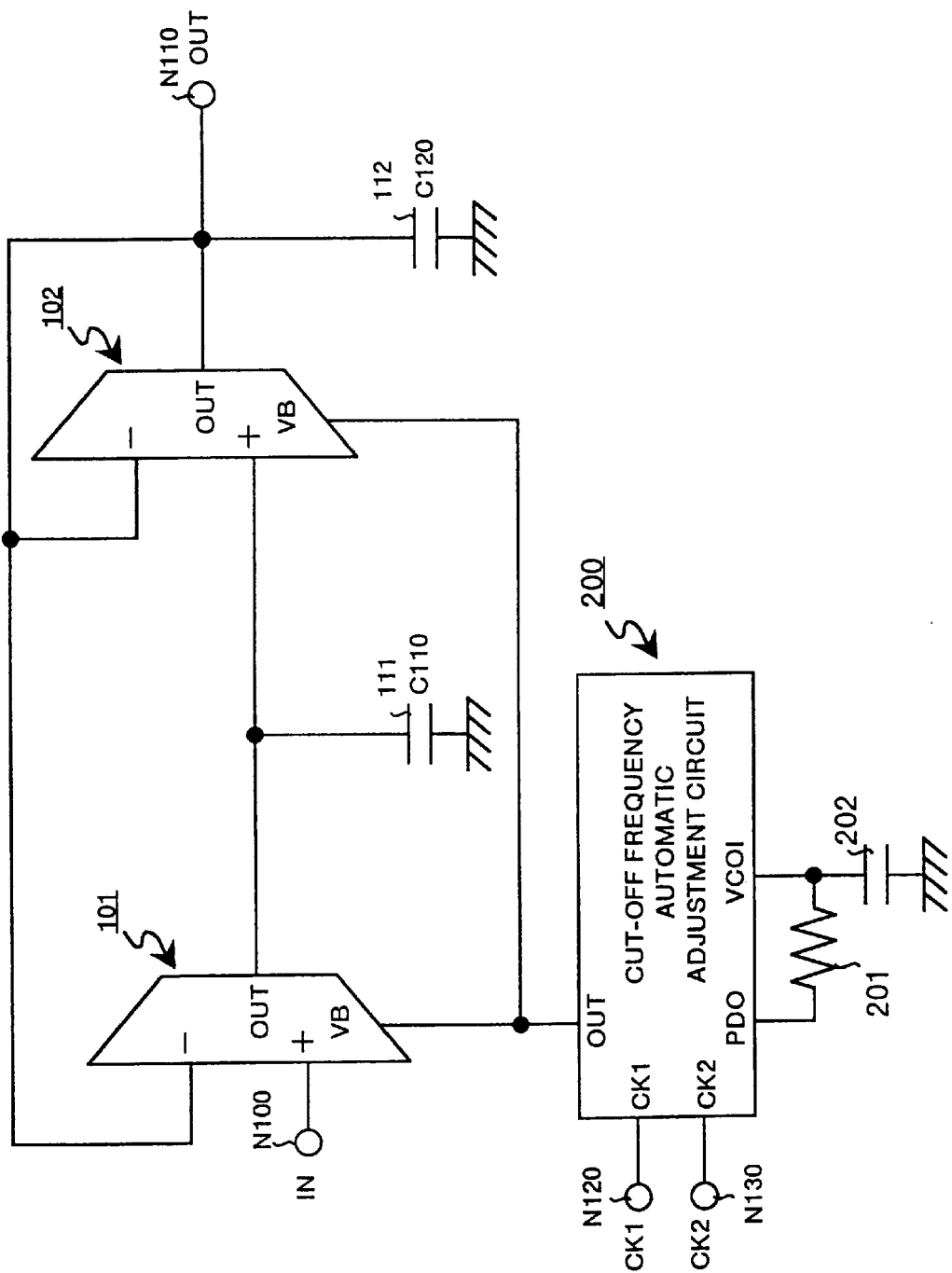
FIG. 5 is a circuit diagram showing a structure of a conventional filter circuit having the OTA and cut-off frequency automatic adjustment circuit.

In the beginning, a filter circuit according to a first embodiment of the present invention will be described. FIG. 1A and FIG. 1B are circuit diagrams showing a structure of a filter circuit of the first embodiment. The same reference numerals are provided to the components having the same structure as in FIG. 5 and a description thereof is omitted. Referring to FIG. 1A, the filter circuit of the first embodiment comprises OTA 11, OTA 12 and a cut-off frequency automatic adjustment circuit 200, and the OTA 11 and OTA 12 correspond to the aforementioned OTA 101 and OTA 102 respectively.

Specifically, in the filter circuit shown in FIG. 1A, n analog switches AS11 to AS1n and capacitors 31 to 3n (capacitances C11 to C1n) each having a different capacitance connected to these analog switches are connected to an output terminal of the OTA 11, which is different from the conventional filter circuit in which only one capacitor 111 is connected to an output terminal of the OTA 101.

To explain precisely, a contact terminal of each of the analog switches AS11 to AS1n is connected to the output terminal of the OTA 11 in parallel and the capacitors 31 to 3n are respectively connected to the other contact terminal of each of these analog switches AS11 to AS1n. For example, the output terminal of the OTA 11 is connected to a contact terminal of the analog switch AS11 and one terminal of the capacitor 31 is connected to its other contact terminal. The other terminal of the capacitor 31 is grounded.

As described, n pairs containing an analog switch and a capacitor are connected to the output terminal of the OTA 11 in parallel. Each of the analog switches AS11 to AS1n inputs a switching signal SW11 to SW1n respectively to a N-channel type MOS transistor and a switching signal SW11i to SW1ni respectively to a P-channel type MOS transistor.

The switching signals SW11 to SW1n are inputted through each of switching signal input terminals N11 to N1n (FIG. 1B) from outside and the switching signals SW11i to SW1ni are inverse signals obtained by inputting the switching signals SW11 to SW1n into this filter circuits or inverters G11 to G1n provided in an external circuit connected to this filter circuit. Thus, the analog switches AS11 to AS1n are turned ON/OFF by the respective switching signals SW11 to SW1n and the switching signals SW11i to SW1ni.

That is, by inputting a logical level "H" into any one of the switching signal input terminals N11 to N1n, a desired analog switch of the analog switches AS11 to AS1n can be turned ON so that the capacitor connected to this analog switch turned ON can be validated. Because the capacitance of the capacitors 31 to 3n are different, the capacitance of the capacitor interposed between the output terminal of the OTA 11 and grounding line can be changed by selecting the analog switch to be turned ON.

In the filter circuit shown in FIG. 1A, like the case of the aforementioned OTA 11, m analog switches AS21 to AS2m and capacitors 41 to 4m (capacitances C21 to C2m) each having a different capacitance connected to these analog switches are connected to an output terminal of the OTA 12, which is different from the conventional filter circuit in which only one capacitor 112 is connected to the output terminal of the OTA 102.

To explain precisely, as shown in FIG. 1A, contact terminals of each of the analog switches AS21 to AS2m are connected to the output terminal of the OTA 12 in parallel and capacitors 41 to 4m are connected to the other contact terminals of these analog switches AS21 to AS2m. For example, the output terminal of the OTA 12 is connected to a contact terminal of the analog switch AS21 and one terminal of the capacitor 41 is connected to its other contact terminal. The other terminal of the capacitor 41 is grounded.

As described above, m pairs each containing an analog switch and a capacitor are connected to the output terminal of the OTA 12 in parallel. Each of the analog switches AS21 to AS2m inputs a switching signal SW21 to SW2m respectively to the N-channel type MOS transistor and switching signals SW21i to SW2mi respectively to the P-channel type MOS transistor.

Like the aforementioned switching signals SW11 to SW1n and switching signals SW11i to SW1ni, the switching signals SW21 to SW2m are inputted through the switching signal input terminals N21 to N2m from outside. As shown in FIG. 1B, the switching signals SW21i to SW2mi are inverse signals obtained by inputting the switching signals SW21 to SW2m into inverters G21 to G2m provided on or an external circuit connected to this filter circuit. Thus, the analog switches AS21 to AS2m are turned ON/OFF by the respective switching signals SW21 to SW2m and the switching signals SW21i to SW2mi.

That is, by inputting a logical level "H" into any one of the switching signal input terminals N21 to N2m, a desired analog switch of the analog switches AS21 to AS2m can be turned ON so that a capacitor connected to this analog switch turned ON can be validated. Because the capacitances of the respective capacitors 41 to 4m are different, the capacitance of a capacitor interposed between the output terminal of the OTA 12 and grounding line can be changed by selection of the analog switch to be turned ON.

With the structure described above, by inputting the logical level "H" into any one of the switching signal input terminals N11 to N1n and then inputting the local level "H" into any one of the switching signal input terminals N21 to N2m, the capacitances of the capacitors constituting the OTA 11, OTA 12 and the filter section can be set to a desired value.

Here, the cut-off frequency fc and quality factor Q of this filter circuit are expressed as follows with the help of a capacitance (here, C1k) of a selected capacitor of the capacitors 31 to 3*n*, a capacitance (here, C2k) of a selected capacitor of the capacitors 41 to 4*m* and transconductance (gm1 and gm2) of each of the OTA 11 and OTA 12, in the similar way as the equation 1.

$$fc = \frac{1}{2\pi}\sqrt{\frac{gm1 \cdot gm2}{C1k \cdot C2k}} \qquad (2)$$

$$Q = \frac{1}{2\pi}\sqrt{\frac{gm1 \cdot C2k}{gm2 \cdot C1k}}$$

As described above, because the capacitances C1k and C2k in the equation 2 can be changed to desired values by changing the capacitors, the cut-off frequency fc of the filter circuit can be changed. On the other hand, as described in the equation 1, the transconductances gm1 and gm2 are determined depending on the bias voltage VB of the OTA 11 and OTA 12, so that the cut-off frequency fc in the cut-off frequency automatic adjustment circuit 200 can also be changed according to the bias voltage VB which can be changed by the frequencies of the clocks CK1 and CK2.

FIG. 2 shows a characteristic graph illustrating a relation between the frequency and the bias voltage VB of the clocks CK1 and CK2. Referring to FIG. 2, when the cut-off frequency fc is adjusted only by changing the bias voltage VB as in the conventional filter circuit, the valid variable range of the frequencies of the clocks CK1 and CK2 inputted into the cut-off frequency automatic adjustment circuit 200 is a range indicated by frequency adjustment range B. In addition, in the filter circuit according to the first embodiment, the frequency adjustment ranges of the clocks CK1 and CK2 can be expanded to a range indicated by a frequency adjustment range A shown in FIG. 2, by changing the capacitor constituting the filter section.

Further, by selecting the capacitors to be connected to the output terminals of the OTA 11 and OTA 12 so that a ratio between the capacitances C1k and C2k in the aforementioned equation 2 is always constant, the cut-off frequency fc can be changed and the quality factor Q can be fixed.

A decoder may be provided at a pre-stage of each of the respective switching signal input terminals into which the aforementioned switching signals SW11 to SW1*n* and switching signals SW2 to SW2*m* are inputted and a capacitor selection data may be inputted into this decoder. For example, in the filter circuit provided with capacitors 31 to 34 and capacitors 41 to 44, by making 2-bit data "00", "01", "10", "11" correspond to capacitors 31, 41, capacitors 32, 42, capacitors 33, 43, capacitors 34, 44 respectively and then inputting this data into the aforementioned decoder as capacitor selection data, selection of the capacitor can be simplified.

As described above, in the filter circuit according to the first embodiment, the filter section comprising the OTA 11, a capacitor connected to this OTA 11, the OTA 12 and a capacitor connected to the OTA 12 is equipped with a plurality of capacitors connected to the respective OTAs and analog switches capable of selecting some of the plural capacitors are connected to the respective capacitors. Therefore, the bias voltages VB of the OTAs 11 and 12 to be outputted from the cut-off frequency automatic adjustment circuit 200 can be changed by the frequencies of the clocks CK1 and CK2, and further, capacitance of the capacitor, which is one of the parameters that determine the cut-off frequency fc, can be changed and hence the adjustment range of the cut-off frequency can be widened. As a result, it is possible to provide a filter circuit more flexible and having a higher general purpose property.

Figure 6:
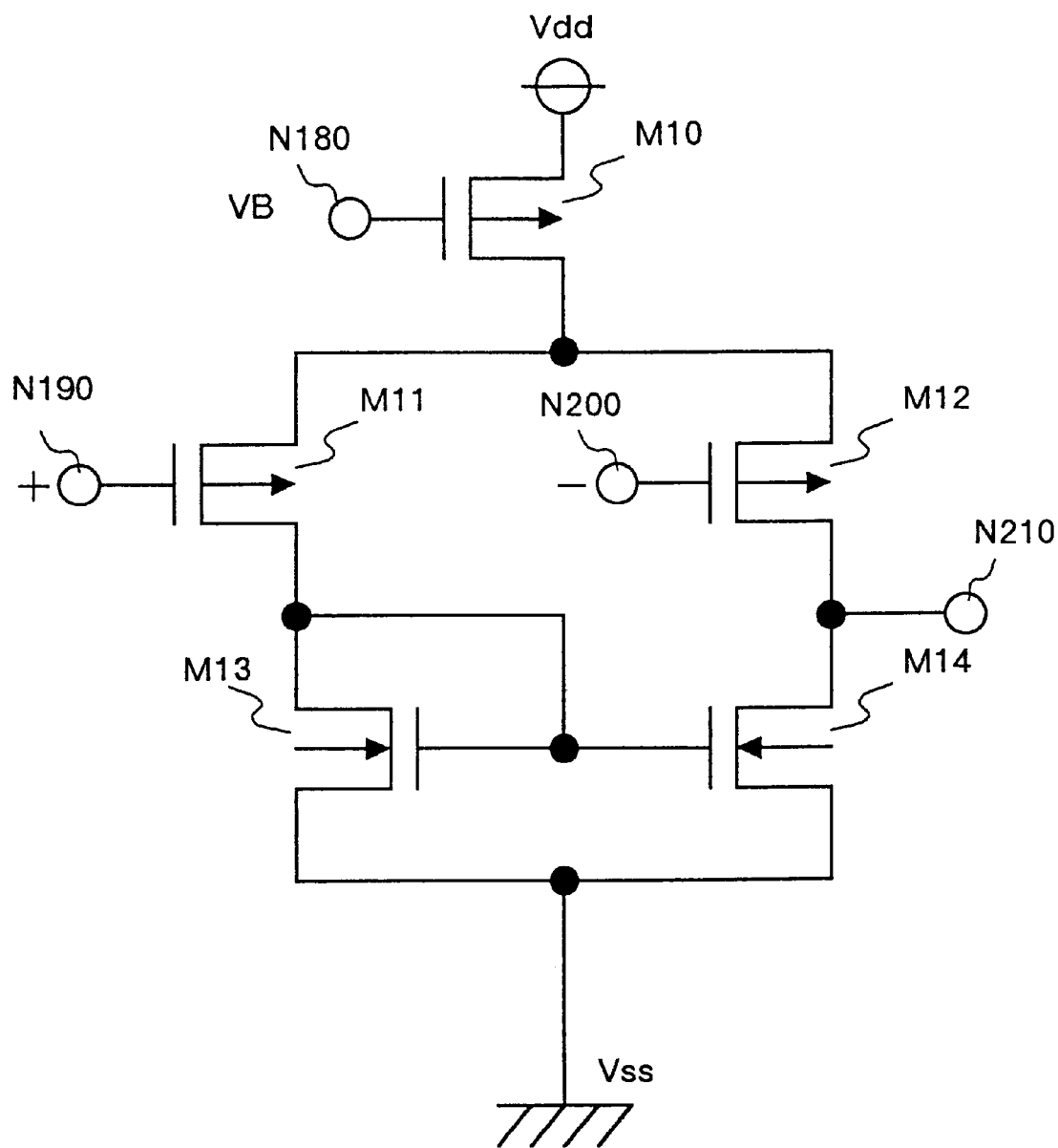
FIG. 6 is a circuit diagram showing a structure of the OTA in the conventional filter circuit.

A filter circuit according to a second embodiment will be described here. In the filter circuit of the second embodiment, by changing a transistor size W/L of the MOS transistor in which the bias voltage VB is inputted in an internal circuit of the OTAs 101 (W'/L') and 102 (W"/L") of the conventional filter circuit shown in FIG. 5, an internal circuit of the OTAs 11 and 12 of the first embodiment, namely in a differential amplifier shown in FIG. 6, the automatic adjustment of the frequency by the cut-off frequency automatic adjustment circuit 200 is carried out and further, the adjustment range of the cut-off frequency is expanded.

As described in the above equation 1, the transconductance gm1 or gm2 of the OTA is a parameter that determines the cut-off frequency fc. Further, the transistor size W/L of the MOS transistor into which the bias voltage is inputted is a parameter that determines these transconductances gm1, gm2. Therefore, the cut-off frequency fc can be changed by changing this transistor size W/L.

The change in the transistor size W/L is achieved by preparing a plurality of MOS transistors for bias voltage VB input having different transistor sizes and selecting any one of these MOS transistors by using an analog switch.

Figures 3A, 3B:
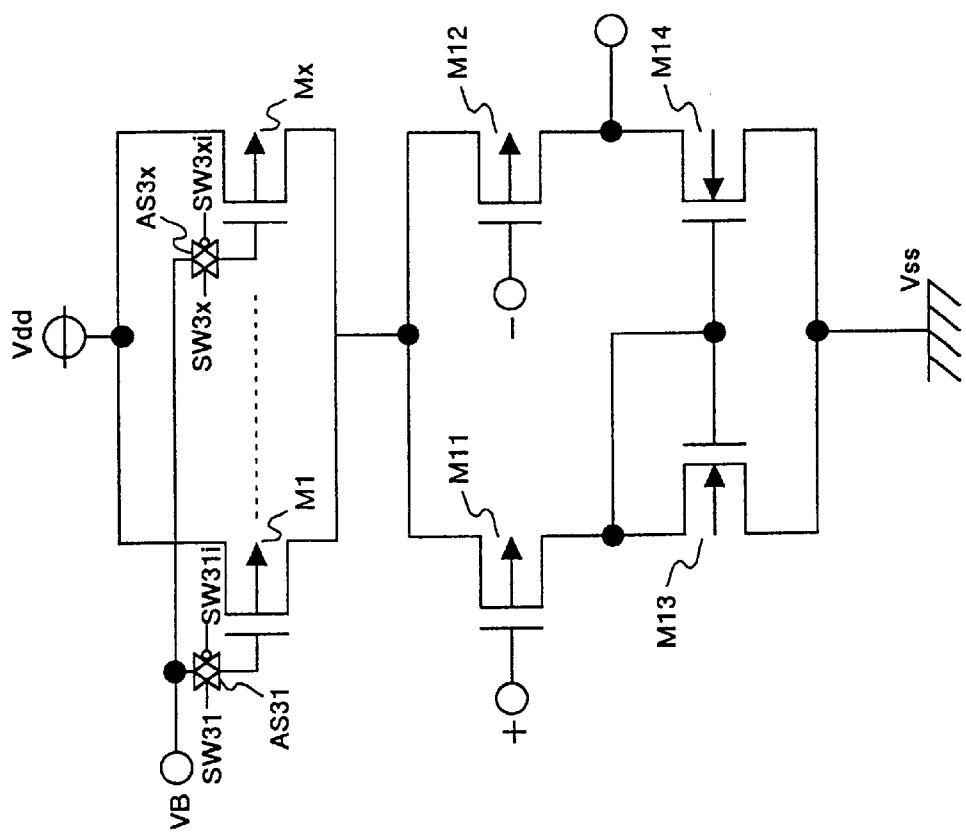
FIG. 3A and FIG. 3B are diagrams showing internal circuit of the OTA in the filter circuit of a second embodiment.

FIG. 3A and FIG. 3B are diagrams showing an internal circuit of the OTA in the filter circuit according to the second embodiment. The same reference numerals are provided to the components having the same structure as in FIG. 6 and a description thereof is omitted. In the internal circuit shown in FIG. 3A or the differential amplifier section, x number of P-channel type MOS transistors M1 to M*x* each having a different transistor size are connected in parallel between a power source voltage Vdd and a joint between sources of a MOS transistor M11 and MOS transistor M12.

A contact terminal of each of the analog switches AS31 to AS3*x* is connected to each gate of these MOS transistors M1 to M*x*. A bias voltage VB line for supplying a bias voltage VB outputted from the cut-off frequency automatic adjustment circuit 200 is connected to its other contact terminal.

In the analog switches AS31 to AS3*x*, the respective switching signals SW31 to SW3*x* are inputted into the N-channel type MOS transistor and the respective switching signals SW31*i* to SW3*xi* are inputted into the P-channel type MOS transistor.

The switching signals SW31 to SW3*x* are inputted into the respective switching signal input terminals N31 to N3*x* from outside. As shown in FIG. 3B, the switching signals SW31*i* to SW3*xi* are inverse signals obtained by inputting the switching signals SW31 to SW3*x* into this filter circuit or inverters G31 to G3*x* provided in an external circuit connected to this filter circuit. Therefore, the respective analog switches AS31 to AS3*x* can be turned ON/OFF with the help of the respective switching signals SW31 to SW3*x*.

That is, by inputting a logical level "H" into any one of the switching signal input terminals N31 to N3*x*, a desired analog switch of the analog switches AS31 to AS3*x* can be turned ON and further, a MOS transistor connected to this analog switch turned ON can also be turned ON. Because the transistor size of the MOS transistors M1 to M*x* are different, the transconductance of the OTA 11 or OTA 12 can be changed by selecting the analog switch to be turned ON.

When the cut-off frequency fc is adjusted only by changing the bias voltage VB as in the conventional filter circuit, as shown in FIG. 2, the valid variable range in which the frequencies of the clocks CK1 and CK2 inputted into the cut-off frequency automatic adjustment circuit 200 is a range indicated by the frequency adjustment range B. In addition, in the filter circuit according to the second embodiment, the frequency adjustment range for the clocks CK1 and CK2 can be extended up to a range indicated by the frequency adjustment range A shown in FIG. 2, by changing the transistor size of the MOS transistor for OTA bias voltage inputs constituting a filter section of the filter circuit.

Although in an internal circuit of the OTA in the above described filter circuit, a plurality of the MOS transistors M1 to Mx, which can be a MOS transistor for bias voltage VB, are each provided each with an analog switch, it is permissible to connect the bias voltage VB line to the gates of the respective MOS transistors M1 to Mx, connect a contact terminal of each analog switch to a drain of each of the respective MOS transistors M1 to Mx and then connect the other contact terminal of each analog switch to a junction between sources of the MOS transistor M11 and MOS transistor M12.

As described above, according to the filter circuit of the second embodiment, within each OTA of the filter section comprising the OTA 11, the capacitor connected to this OTA 11, OTA 12 and the capacitor connected to the OTA 12, a plurality of P-channel type MOS transistors M1 to Mx each having a different transistor size are provided between the junction between the power source voltage Vdd and the source of the MOS transistor M11 and the source of the MOS transistor M12 and then analog switches capable of selecting from the plurality of the MOS transistors are connected to respective capacitors. Therefore, the bias voltage VB of the OTAs 101 and 102 in the conventional filter circuit shown in FIG. 5 or OTA 11 and OTA 12 of the first embodiment, namely the bias voltage outputted from the cut-off frequency automatic adjustment circuit 200 can be changed by the frequencies of the clocks CK1 and CK2 and the transistor size, which is one of parameters that determine the cut-off frequency fc, of the MOS transistor for bias voltage VB input. Hence, the adjustment range for the cut-off frequency can be widened further. As a result, it is possible to provide a filter circuit more flexible and having a higher general purpose property.

A filter circuit according to the third embodiment will be described here. According to the filter circuit of the third embodiment, in the aforementioned cut-off frequency automatic adjustment circuit 200 (see FIG. 7), by changing a ratio of the resistances of the resistor 213 and resistor 214 which divide the voltage inputted into an inverse phase input terminal of the OTA 103 and an inverse phase input terminal of the comparator 240, the variable range of the bias voltage VB outputted from the cut-off frequency automatic adjustment circuit 200 is expanded and the adjustment range of the cut-off frequency is widened.

Figure 7:
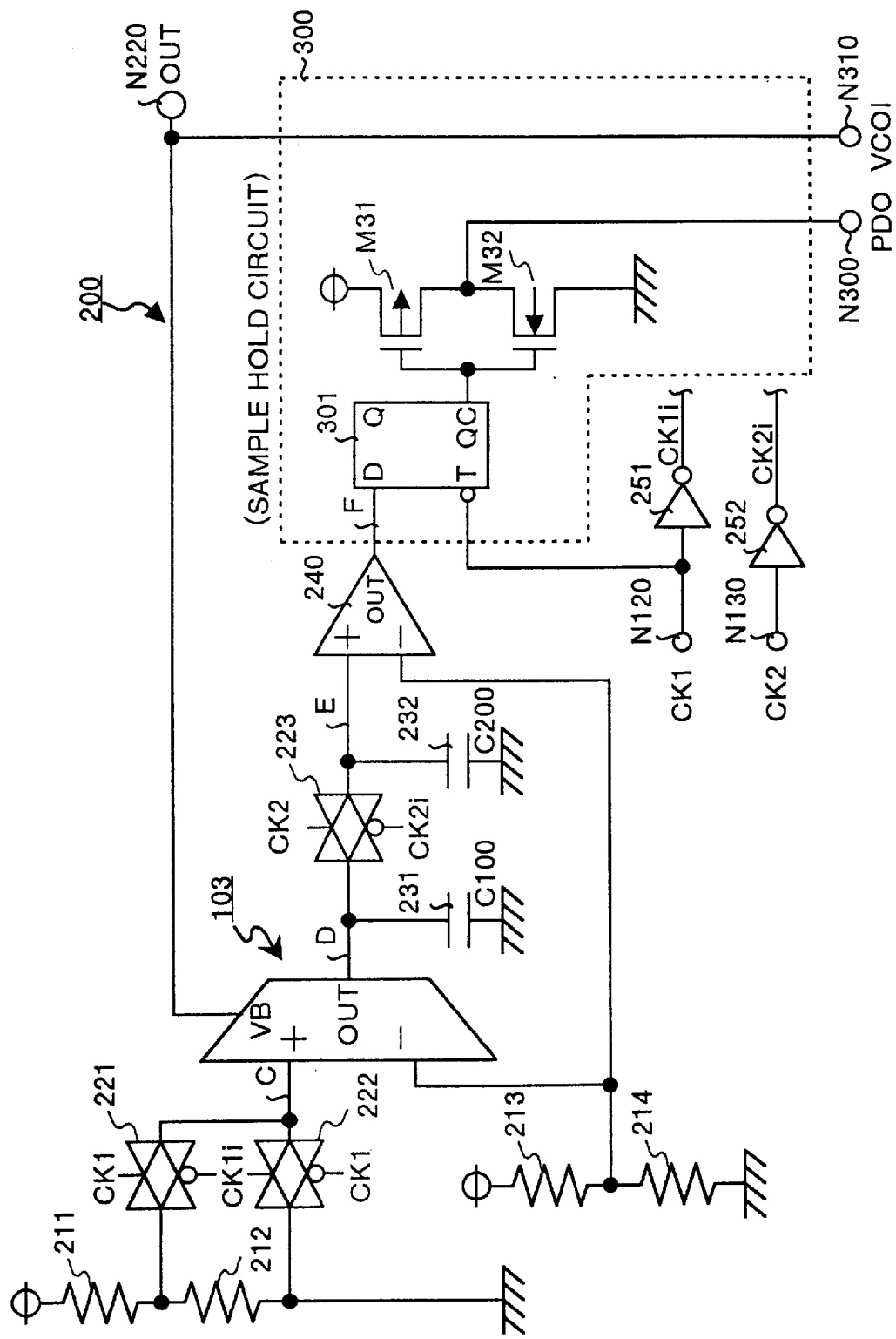
FIG. 7 is a circuit diagram showing the structure of the cut-off frequency automatic adjustment circuit of the conventional filter circuit.

As described with relation to FIG. 7, the partial voltage determined by the resistors 213 and 214 determines a magnitude of an output voltage of the OTA 103 as a reference voltage, so that voltages charged to the capacitors 231 and 232 are determined. Further, the comparator 240 determines whether or not logical level "H" is to be outputted to the sample hold circuit 300 based on this reference voltage.

Therefore, by changing this reference voltage, the range of the voltage held by the capacitor 202 connected to the VCOI terminal can be widened, so that the variable range of the bias voltage VB outputted from the cut-off frequency automatic adjustment circuit 200 can be expanded, that is, the cut-off frequency fc can be changed.

The change of the reference voltage is achieved by preparing a plurality of resistors each having a different resistance and selecting any one of these resistors instead of the resistor 214 with the analog switch.

Figure 4A:
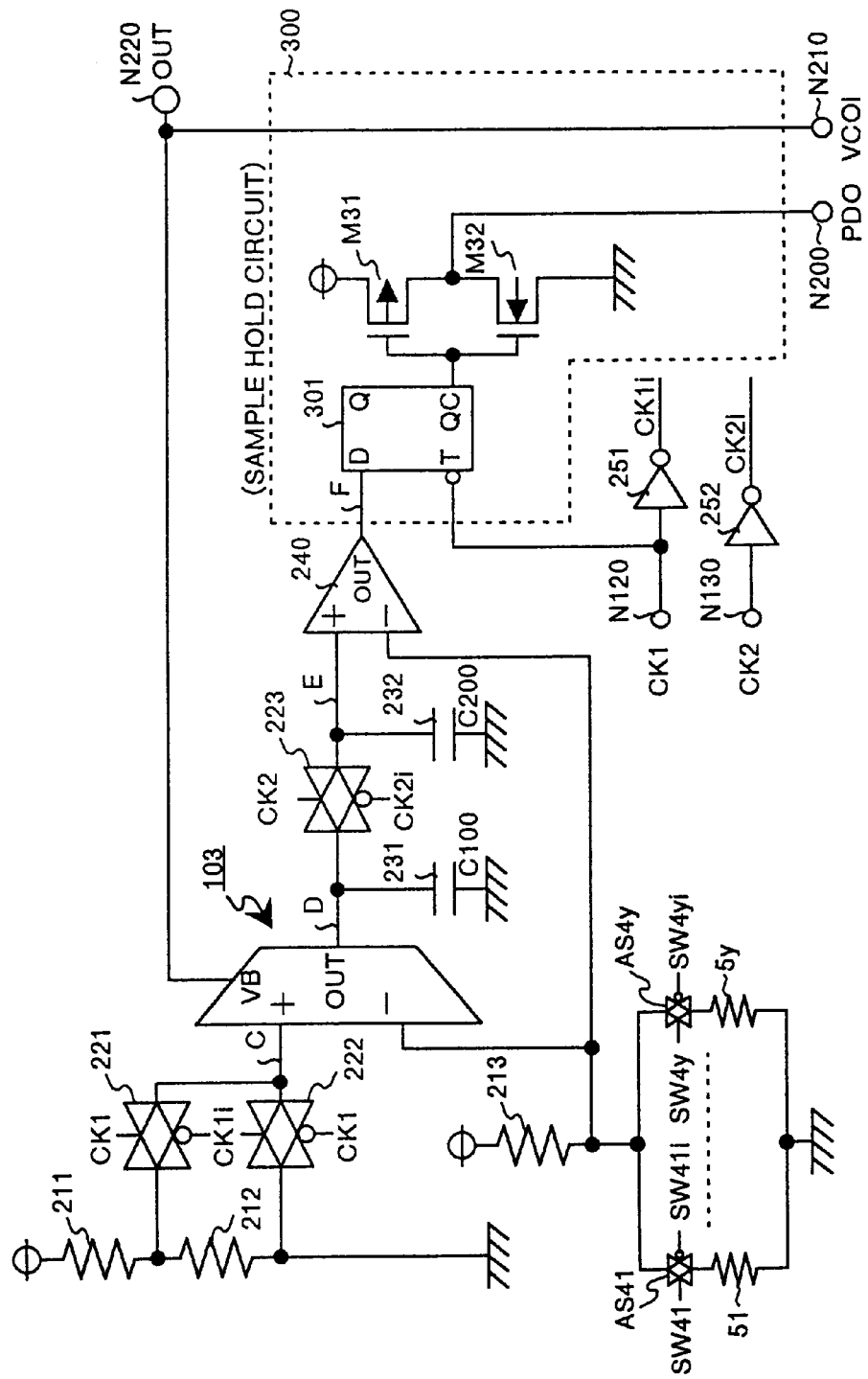
FIG. 4A and FIG. 4B are diagrams showing a cut-off frequency automatic adjustment circuit in the filter circuit of a third embodiment.
Figure 4B:
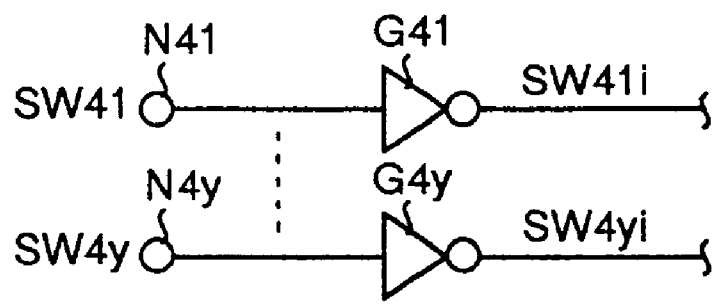

FIG. 4A and FIG. 4B are diagrams showing the cut-off frequency automatic adjustment circuit in the filter circuit of the third embodiment. The same reference numerals are provided to the components having the same structure as in FIG. 7 and a description thereof is omitted. In the cut-off frequency automatic adjustment circuit shown in FIG. 4A, y number of resistors 51 to 5y each having a different resistance are arranged in parallel between the resistor 213 and the grounding line.

A contact terminal of each of the analog switches AS41 to AS4y is connected to one of the terminals of these resistors 51 to 5y and a resistor 213 is connected to its other contact terminal. The other terminals of the resistors 51 to 5y are connected to the grounding line.

In the analog switches AS41 to AS4y, respective switching signals SW41 to SW4y are inputted into the N-channel type MOS transistor thereof and respective switching signals SW41$i$ to SW4y$i$ are inputted into the P-channel type MOS transistor.

The switching signals SW41 to SW4y are inputted through the respective switching signal input terminals N41 to N4y from outside. As shown in FIG. 4B, the switching signals SW41$i$ to SW4y$i$ are inverse signals obtained by inputting the switching signals SW41 to SW4y into this filter circuit or inverters G41 to G4y provided in an external circuit connected to this filter circuit. Thus, the respective analog switches AS41 to AS4y can be turned ON/OFF with the help of the respective switching signals SW41 to SW4y.

That is, by inputting a logical level "H" into any one of the switching signal input terminals N41 to N4x, a desired analog switch of the analog switches AS41 to AS4x can be turned ON and further, a resistor connected to this analog switch turned ON can be validated as a resistor for generating the reference voltage. Because the resistances of the resistors 51 to 5y are different, the ratio of the partial voltages between the selected resistor and resistor 213 can be changed in order to change the reference voltage by selecting the analog switch to be turned ON.

When the cut-off frequency fc is adjusted only by changing the bias voltage VB like in the conventional filter circuit, as shown in FIG. 2, the valid variable range in which the frequencies of clocks CK1 and CK2 inputted into the cut-off frequency automatic adjustment circuit 200, is a range indicated by the frequency adjustment range B. In addition, in the filter circuit according to the third embodiment, the frequency adjustment range for the clocks CK1 and CK2 can be extended up to a range indicated by the frequency adjustment range A shown in FIG. 2, by changing the resistance for generating the reference voltage in the cut-off frequency automatic adjustment circuit 200.

As described above, according to the filter circuit of the third embodiment, as a resistor of two resistor for generating the reference voltage for determining the voltage of the bias voltage VB in the cut-off frequency automatic adjustment circuit 200, a plurality of resistors each having a different resistance are provided in parallel with the analog switches. Thus, by turning this analog switch ON/OFF, the reference voltage can be changed. Therefore, bias voltage VB of the OTAs 101 and 102 in the conventional filter circuit shown in FIG. 5 or OTA 11 and OTA 12 of the first embodiment, namely the bias voltage outputted from the cut-off frequency automatic adjustment circuit 200 can be changed to a wider range with the help of the frequencies of the clocks CK1 and CK2 and the adjustment range of the cut-off frequency can be widened. As a result, it is possible to provide a filter circuit more flexible and having a higher general purpose property.

In the filter circuit according to a first aspect of the present invention, a bias voltage outputted from the cut-off frequency automatic adjustment unit is inputted into the bias voltage input terminal of the operation transconductance amplifier (OTA), and a plurality of capacitors each having a different capacitance are connected to the output terminal of the operation transconductance amplifier. Further, one of a plurality of these capacitors is selected as the capacitor to be connected to the operation transconductance amplifier. Therefore, the frequency adjustment range of the cut-off frequency automatic adjustment unit can be changed so as to be wider, thereby obtaining a filter circuit more flexible and having a high general purpose property.

In the filter circuit according to a second aspect of the present invention, the bias voltage outputted from the cut-off frequency automatic adjustment unit is inputted into a bias voltage input terminal of the first and the second operation transconductance amplifier (OTA), and a plurality of the capacitors each having a different capacitance are connected to the output terminal of these first and second operation transconductance amplifiers through analog switches. Further, the cut-off frequency automatic adjustment unit automatically adjusts the cut-off frequency of a filter section comprising the first and the second operation transconductance amplifiers and said first and second capacitors by changing the bias voltages inputted into the first and the second operation transconductance amplifiers based on the frequency of a clock signal inputted from outside. Further, one of a plurality of capacitors is selected as the capacitor to be connected to the first operation transconductance amplifier with the help of analog switches and one of a plurality of capacitors is selected as the capacitor to be connected to the first operation transconductance amplifier with the help of analog switches. Therefore, the bias voltage to be inputted into the operation transconductance amplifier can be changed based on the frequency of the clock signal supplied from outside, and further, the frequency adjustment range of the cut-off frequency automatic adjustment unit can be changed so as to be wider, thereby obtaining a filter circuit more flexible and having a high general purpose property.

In the filter circuit according to a third aspect of the present invention, the bias voltage outputted from the cut-off frequency automatic adjustment unit is inputted into a bias voltage input terminal of the operation transconductance amplifier (OTA) This operation transconductance amplifier has a plurality of transistors each having a different transistor size into which the bias voltage from the cut-off frequency automatic adjustment unit may be inputted. Further, one of a plurality of these transistors is selected as the transistors to which the bias voltage from the cut-off frequency automatic adjustment unit may be inputted. Therefore, the frequency adjustment range of the cut-off frequency automatic adjustment unit can be changed so as to be wider, and further, it becomes possible to change the bias voltage to be inputted into the operation transconductance amplifier based on the frequency of the clock signal supplied from outside, thereby obtaining a filter circuit more flexible and having a high general purpose property.

In the filter circuit according to a forth aspect of the present invention, a bias voltage outputted from a cut-off frequency automatic adjustment unit is inputted into a bias voltage input terminal of an operation transconductance amplifier (OTA), and the cut-off frequency automatic adjustment unit has a sample hold circuit for holding a voltage to be inputted into the operation transconductance amplifier. This sample hold circuit has a plurality of resistors each having a different resistance and a selectingunitforselectinganyoneof thesepluralityof resistors. Therefore, the bias voltage to be inputted into the operation transconductance amplifier can be changed based on the frequency of the clock signal supplied from outside, thereby obtaining a filter circuit more flexible and having a high general purpose property.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A filter circuit comprising:

a first operation transconductance amplifier having a positive phase input terminal into which an input signal is input;

a plurality of first switching units connected in parallel to an output terminal of said first operation transconductance amplifier;

a plurality of first capacitors, each first capacitor having a different capacitance, connected in series to respective ones of said first switching units;

a second operation transconductance amplifier having a positive phase input terminal connected to an output terminal of said first operation transconductance amplifier;

a plurality of second switching units connected in parallel to an output terminal of said second operation transconductance amplifier;

a plurality of second capacitors, each second capacitor having a different capacitance, connected in series to respective ones of said second switching units; and an automatic cut-off frequency adjustment unit for automatically adjusting the cut-off frequency of a filter section comprising said first and second operation transconductance amplifiers and said first and second capacitors by changing bias voltages of said first and second operation transconductance amplifiers based on a clock signal frequency, wherein one of said first capacitors to be connected to the output terminal of said first operation transconductance amplifier is selected by one of said first switching units and one of said second capacitors to be connected to the output terminal of said second operation transconductance amplifier is selected by one of said second switching units.

2. A filter circuit comprising: a filter having an operation transconductance amplifier having input and output terminals and including a plurality of bias voltage input transistors, each bias voltage input transistor having a different size, a plurality of capacitors selectably connectable to the output terminal of said operation transconductance amplifier, and an automatic cut-off frequency adjustment unit, wherein one of said bias voltage input transistors of said operation transconductance amplifier is selected for receiving a bias voltage input to said operation transconductance amplifier, thereby changing a frequency adjustment range of said automatic cut-off frequency adjustment unit.

3. The filter circuit according to claim 1 wherein each of said first and second operation transconductance amplifiers includes a plurality of respective bias voltage input transistors, said bias voltage input transistors within each of said first and second operation transconductance amplifiers having different sizes, wherein said automatic cut-off frequency adjustment unit selects one of said bias voltage input transistors of each of said first and second operation transconductance amplifiers for receiving a bias voltage, thereby changing a frequency adjustment range of said automatic cut-off frequency adjustment unit.

* * * * *